United States Patent [19]

Fesenmeier et al.

[11] Patent Number: 4,853,666
[45] Date of Patent: Aug. 1, 1989

[54] PUSH BUTTON FOR AN INDUCTIVE VALUE INPUT KEYBOARD

[75] Inventors: Hugo Fesenmeier, Braünlingen; Oskar Zumkeller, Villingen-Schwenningen; Werner Schneider; Hans Grieser, both of Oberndorf, all of Fed. Rep. of Germany

[73] Assignee: Mannesmann Kienzle GmbH, VS-Villingen, Fed. Rep. of Germany

[21] Appl. No.: 200,623

[22] Filed: May 31, 1988

[30] Foreign Application Priority Data

May 29, 1987 [NL] Netherlands ............... 8707707

[51] Int. Cl.⁴ ................................ H01F 21/00
[52] U.S. Cl. ............................. 336/130; 336/136; 341/32
[58] Field of Search ............ 341/32; 340/737; 336/130, 131, 136, 200

[56] References Cited

U.S. PATENT DOCUMENTS 3,911,429 10/1975 Vinal ............................. 341/32
4,117,438 9/1978 Kim ............................ 336/200 X
4,307,366 12/1981 Fujita ........................... 336/136

Primary Examiner—Thomas J. Kozma
Attorney, Agent, or Firm—Toren, McGeady & Associates

[57] ABSTRACT

A push button for an inductive value input keyboard having a push-button socket, a push-button head guided in the push-button socket, a compression spring which acts between the push-button socket and the push-button head, a stop which limits the stroke of the push button in the non-actuated state, and a rod-shaped iron core fastened to the push-button head for interaction with an induction coil formed by conductor paths upon a printed circuit board on which the push button is arranged. A sleeve is molded at the push-button head and has a non-cylindrical aperture therethrough and is elastically deformable transverse to its axis within which the iron core is clamped.

7 Claims, 2 Drawing Sheets

PUSH BUTTON FOR AN INDUCTIVE VALUE INPUT KEYBOARD

BACKGROUND OF THE INVENTION

1. Field of the Invention

The subject invention is related to a push button for an inductive value input keyboard, having a push-button socket, a push-button head guided in the push-button socket, a compression spring with stop means acting between the push-button socket and the push-button head, the stop means limiting the stroke of the push button in a non-actuated state, and a rod-shaped iron core fastened to the push-button head for acting with an induction coil formed by conductor paths upon a printed circuit board on which the push button is located.

2. Description of Related Art

In known push button designs, the push-button head consists of a cover cap and a support at which the guidance shaft of the push button is molded, and in which apertures are formed into which locks or detent hooks molded at the socket of the push button engage for the purpose of arresting the push-button head in the end position. An iron or ferrite pin of high permeability for signal generation is usually embedded in the support by injection molding.

The apertures and the locks, as well as the opposed submerged openings and sink marks, in the support can be faced or closed off towards the outside by means of the cover cap without any problems. During the embedding process of the ferrite pins there exists, additionally, the danger that, on the one hand, the receptacle for the ferrite pins in the injection mould wears out relatively rapidly because of the hardness of the ferrite pins and thus resulting in no acceptable positional tolerances, and, on the other hand, there is the danger that splinters, which chip off when handling the relatively brittle ferrite pins, can interfere with the positive locking.

If the push-button head is fabricated as one part, in order to achieve as shallow as possible a construction suitable for quantity production, an embedding of the ferrite pin is not possible because of the danger of sink marks. In this case, the ferrite pin must be pressed into a suitable mounting, which, in the case of a ferrite pin, is only possible with accuracy requiring a great effort, or it has to be bonded in, which, in quantity production, particularly if a mechanical installation of the push button is desired, results in an unsuitable fabrication process.

SUMMARY OF THE INVENTION

An object of the present invention is to construct a push-button head in such a way that the ferrite pin can be mechanically installable with fabrication tolerances usual in quantity production.

The above object is achieved in a push button having a sleeve molded at the push-button head, the sleeve having a non-cylindrical aperture therethrough and being elastically deformable transverse to its axis, wherein the iron core is clamped in the sleeve.

A preferred embodiment of the sleeve is characterized in that the sleeve aperture is bounded by cylindrical segments of differing diameter lying in pairs opposite each other and by end faces connecting them.

The advantage of the subject invention is that the dimension between the end face of the sleeve and the end face of the iron core facing outwards is accurately defined and randomly reproducible, particularly if the length tolerances of the iron core fluctuate greatly. In addition, the fabrication expense is considerably reduced by the fact that the diameter tolerance spread of the iron cores can be considerably broader that has to be specified for an embedded or pressed in process by molding technology. Moreover, the subject invention effects an accurately aligned seat of the iron core even with high installation speeds. Furthermore, the construction is advantageous in which the sleeve is integrated into the intersection of two side walls of the push-button head. The forming tool can be applied on one side externally in the invention, meaning that it assures an improved accessibility during installation.

BRIEF DESCRIPTION OF THE DRAWINGS

With the above objects and advantages in mind as will hereinafter appear, the subject invention will be described with reference to the accompanying drawings, in which.

DESCRIPTION OF THE PREFERRED EMBODIMENT

Figure 1:
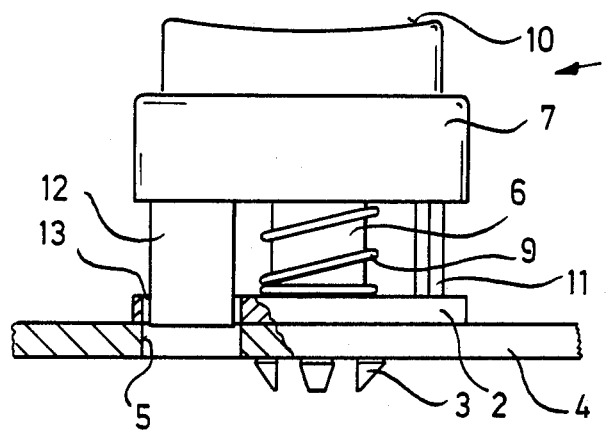
FIG. 1 is a side view, partly in section, of a push button of the subject invention mounted on a printed circuit board.

In FIG. 1, a push button 1 is shown fastened to a printed circuit board 4 by means of detent hooks formed on a push-button sleeve 2, of which one hook is designated with the reference number 3. The printed circuit board 4 has conductor paths crossing each other applied on both sides of the board 4, which, while not visible in the figure, are not essential to the invention. The conductor paths form, together with a bore 5, an induction coil for the inductive keyboard. A guidance sleeve 6 is molded at the push-button socket 2 in which is guided a shaft 8 configured at the push-button head 7. The guidance sleeve 6 is supported by a pressure spring 9 which is effective between the push-button socket 2 and the push-button head 7 and supplies the opposing force when operating the push button 1. A finger 11 is attached at the push-button head 7 and is molded as a hollow member open on one side which can be structured in a suitable manner and configured as a gripping surface 10. The finger 11 engages into suitable apertures in the push-button socket 2 and the printed circuit board 4 and thus serves as a security against rotation of the push-button head 7. An iron core, preferably a ferrite pin, bears the reference number 12 and is retained in the push-button head 7 in a unique manner and engages an aperture 13 located in the push-button socket 2 in the non-actuated state of the push button 1.

Figure 2:
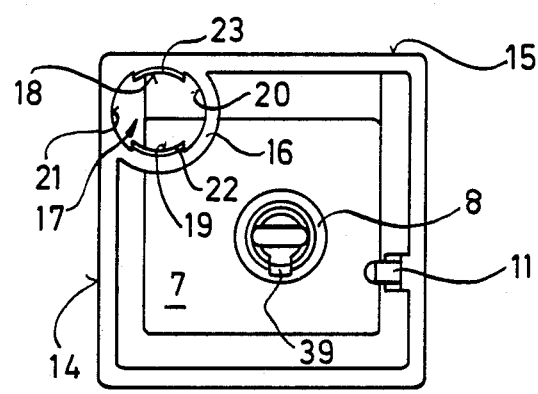
FIG. 2 is a bottom view of the push-button head fabricated in accordance with the invention.

FIG. 2 shows that the sleeve 16 is integrated into the intersection of two side walls 14 and 15 of the push-button head 7. The non-cylindrical sleeve opening 17 is limited by cylindrical segments of differing diameters 18, 19 and 20, 21, lying in pairs opposite to each other and have end faces connecting these pairs. Jaws 22 and 23, correspondingly protruding into the sleeve opening, serve for clamping and retention of the ferrite pin 12 inserted into the sleeve 16.

Figure 3:
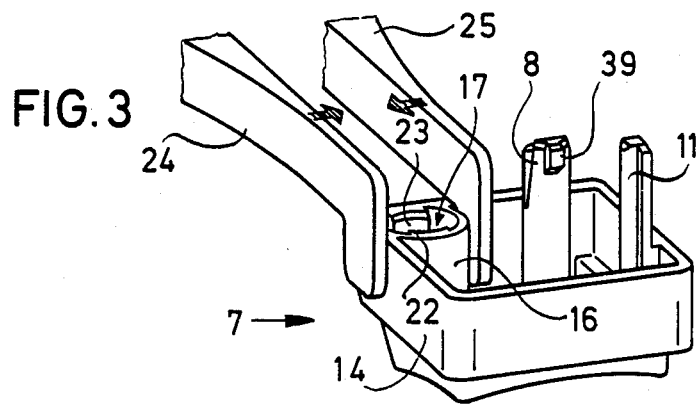
FIG. 3 is a perspective view of the push-button head and of a tool which serves for the deformation of the sleeve containing the iron core.
Figure 4:
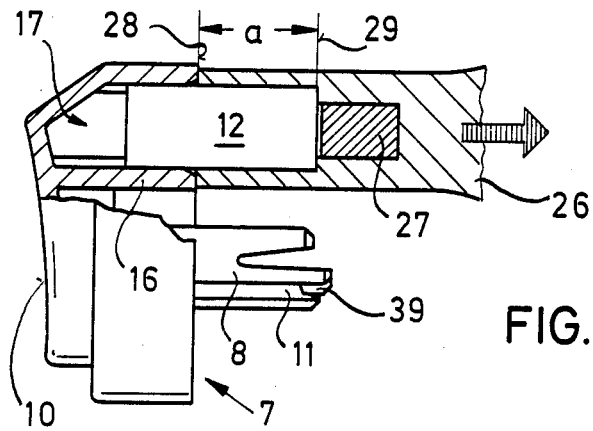
FIG. 4 is a side view, partly in section, of one phase of installation in which the iron core held in an installation tool is set.

In order to be able to introduce the ferrite pin 12 into the sleeve opening 17, the sleeve 16 is elastically deformed to a slight extent transverse to the jaws 22 and 23 wherein the jaws 22 and 23 move away from each other. A plier-like tool can be used for this purpose, whose legs 24 and 25 engage, as far as possible, the entire length of the sleeve 16 as shown in FIG. 3. The ferrite pin 12 is retained in an additional installation tool 26 where it is held by means of a permanent magnet 27 located in the installation tool. The installation tool 26 is applied, according to FIG. 4, onto the end face 28 of the sleeve 16, which must not necessarily lie in the plane of the end faces of the side walls of the push-button head 7. If the deformation tool is released in this installation phase and thus a deformation of the sleeve 16 is cancelled, then the ferrite pin 12 is clamped between the jaws 22 and 23 and the installation tool 24 can be pulled off. The dimension "a" between the end face 28 of the sleeve 16 and the end face 29 of the ferrite pin 12 facing outwards remains always constant in this way, meaning considerable fluctuations in the length measurement of the ferrite pin can be accepted. Thus, the inventive method also creates the premise for a mechanized installation.

Figure 5:
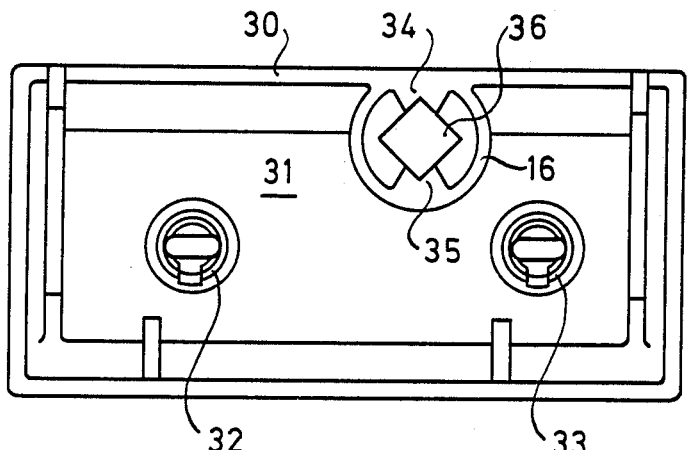
FIG. 5 is a bottom view of a push button with a sleeve designed for receiving a four-cornered iron core.

FIG. 5 shows an embodiment in which the sleeve 16 is configured at only one wall frame 30 of a twin or elongated push button 31 at which two guide shafts 32 and 38 are molded. The jaws 34 and 35 are shaped in such a way that a four-cornered ferrite pin 36, in this case with a square cross-section, can be clamped therebetween.

Figure 6:
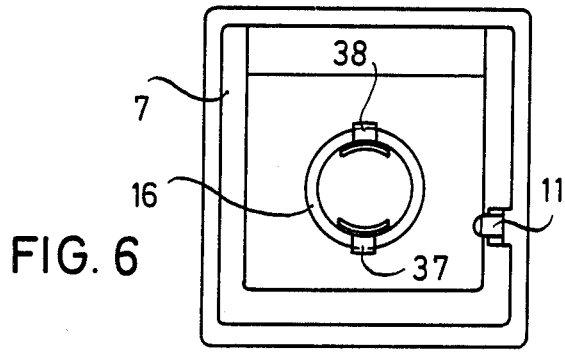
FIG. 6 is a bottom view of a push button with a push-button shaft which is designed as a sleeve for receiving the iron core.

An additional embodiment is shown in FIG. 6. The sleeve 16 is molded at the push-button head 7 in a "freely standing" manner. It has additionally the function of the shaft 8. Correspondingly, locks 37 and 38 are molded upon the sleeve 16, which, like a nose 39 at the shaft 8, serve for limiting the stroke and which coact with a stop face configured at the push-button socket 2 in the non-actuated position of the push button 1.

Numerous alterations of the structure herein disclosed will suggest themselves to those skilled in the art. However, it is to be understood that the above embodiments are for purposes of illustration only and not to be construed as a limitation of the invention. All such modifications which do not depart from the spirit of the invention are intended to be included within the scope of the appeded claims.

What is claimed is:

1. A push button and printed circuit board for an inductive value input keyboard, comprising:
   a push-button socket;
   a push-button head guided in the push-button socket;
   a compression spring which acts between the push-button socket and the push-button head;
   stop means which limits the stroke of the push button in the non-actuated state; and
   a rod-shaped iron core fastened to the push-button head for interaction with an induction coil formed by conductor paths upon the printed circuit board on which the push button is arranged, wherein a sleeve is molded at the push-button head, the sleeve having a non-cylindrical aperture therethrough and being elastically deformable transverse to its axis within which the iron core is clamped.

2. A push button and printed circuit board according to claim 1, characterized in that two jaws pointing inwardly are configured to lie diametrically opposite to each other within the sleeve aperture.

3. A push button and printed circuit board according to claim 1, characterized in that the sleeve aperture is bounded by cylindrical segments of differing diameters lying in pairs opposite each other and end faces connecting the segments.

4. A push button and printed circuit board according to claim 1, characterized in that a finger is asymmetrically formed in the push-button head and extends parallel to the sleeve through respective apertures in the push-button socket and the printed circuit board for preventing the push-button head from rotating.

5. A push button and printed circuit board according to claim 1, characterized in that said locking means comprises a guidance sleeve formed centrally in said push-button head for engaging respective apertures in the push-button socket and the printed circuit board, said guidance sleeve having outwardly facing hooks for engaging an underside of the printed circuit board.

6. A push button and printed circuit board according to claim 1, characterized in that said push-button head is elongated and includes two guidance shafts longitudinally positioned thereon for engaging respective holes in said push-button socket and said printed circuit board.

7. A push button and printed circuit board according to claim 6, characterized in that the iron core has a rectangular cross-section and said sleeve aperture is bounded by diametrically opposing jaws which are shaped for gripping said iron core.

* * * * *